(12) United States Patent
Chuang et al.

(10) Patent No.: US 8,259,510 B2
(45) Date of Patent: Sep. 4, 2012

(54) DISTURB-FREE STATIC RANDOM ACCESS MEMORY CELL

(75) Inventors: Ching-Te Chuang, Taipei (TW); Hao-I Yang, Taipei (TW); Jihi-Yu Lin, Kaohsiung County (TW); Shyh-Chyi Yang, Taipei County (TW); Ming-Hsien Tu, Tainan (TW); Wei Hwang, Taipei (TW); Shyh-Jye Jou, Hsinchu County (TW); Kun-Ti Lee, Hsinchu County (TW); Hung-Yu Li, Pingtung County (TW)

(73) Assignees: Faraday Technology Corp., Science-Based Industrial Park, Hsin-Chu (TW); National Chiao Tung University, Hsinchu (TW)

( * ) Notice: Subject to any disclaimer, the term of this patent is extended or adjusted under 35 U.S.C. 154(b) by 383 days.

(21) Appl. No.: 12/772,238

(22) Filed: May 3, 2010

(65) Prior Publication Data

US 2011/0128796 A1 Jun. 2, 2011

(30) Foreign Application Priority Data

Dec. 1, 2009 (TW) ................................ 98141060 A

(51) Int. Cl.
*G11C 7/00* (2006.01)

(52) U.S. Cl. .................. 365/189.05; 365/154; 365/156; 365/189.04; 365/205

(58) Field of Classification Search ............. 365/189.05, 365/154, 156, 189.04, 205
See application file for complete search history.

(56) References Cited

U.S. PATENT DOCUMENTS

| 7,782,656 | B2 * | 8/2010 | Hsueh et al. ................... 365/154 |
| 7,835,175 | B2 * | 11/2010 | Wang .............................. 365/154 |
| 7,839,697 | B2 * | 11/2010 | Ishikura et al. ........... 365/189.04 |
| 8,164,945 | B2 * | 4/2012 | Houston ....................... 365/156 |

* cited by examiner

*Primary Examiner* — Connie Yoha
(74) *Attorney, Agent, or Firm* — Winston Hsu; Scott Margo

(57) ABSTRACT

A disturb-free static random access memory cell includes: a latch circuit having a first access terminal and a second access terminal; a first switching circuit having a first bit transferring terminal coupled to the first access terminal, a first control terminal coupled to a first write word line, and a second bit transferring terminal; a second switching circuit having a third bit transferring terminal coupled to the second access terminal, a second control terminal coupled to a second write word line, and a fourth bit transferring terminal coupled to the second bit transferring terminal; a third switching circuit having a fifth bit transferring terminal coupled to the fourth bit transferring terminal, a third control terminal coupled to a word line, and a sixth bit transferring terminal coupled to a bit line; and a sensing amplifier coupled to the bit line, for determining a bit value appearing at the bit line.

16 Claims, 9 Drawing Sheets

DISTURB-FREE STATIC RANDOM ACCESS MEMORY CELL

BACKGROUND OF THE INVENTION

1. Field of the Invention

The present invention relates to a static random access memory cell, and more particularly, to a disturb-free static random access memory cell operable under a wide range of supply voltages, and having a high density and high data accessing speed.

2. Description of the Prior Art

Please refer to FIG. 1. FIG. 1 is a diagram illustrating a conventional static random access memory. The static random access memory comprises a static random access memory cell 10 and a sense amplifier (not shown). The conventional static random access memory cell 10 comprises six field effect transistors, i.e., a so-called 6-T static random access memory cell. Me and Mf are the access transistor (also called pass-transistor). The latch circuit 11 comprises two inverters 11a and 11b, and each inverter comprises an N-type Field Effect Transistor (NFET) and a P-type Field Effect Transistor (PFET). When a logic value (i.e., the bit value stored) in the static random access memory cell 10 is read, the voltage level of the first bit line 12 and the second bit line 16 are charged to a high voltage level. Then, the voltage level of the word line 14 is raised to a high voltage level to turn on the field effect transistors Me and Mf. Depending on the data stored in the static random access memory cell, one of the storage node (either Na or Nb) will be at logic "Low" voltage level, and the corresponding bit line (either the first bit line 12, or the second bit line 16) will be pulled down. The sense amplifier of the static random access memory then determines the logic value stored in the latch circuit 11 according to the voltage levels of the first bit line 12 and the second bit line 16.

In addition, when a logic value (i.e., the bit value being written) is written to the static random access memory cell 10, the voltage level of the word line 14 is charged to a high voltage level to turn on the field effect transistors Me and Mf. Then, if the bit value being written is logic 1, the voltage level of the first bit line 12 is charged to the high voltage level and the voltage level of the second bit line 16 is discharged to the low voltage level; or if the bit value being written is logic 0, the voltage level of the first bit line 12 is discharged to the low voltage level and the voltage level of the second bit line 16 is charged to the high voltage level. Accordingly, the logic value (i.e., the bit value being written) is written into the latch circuit 11 by complementing the voltage levels of the first bit line 12 and the second bit line 16.

When the bit value of logic 0 is read from the latch circuit 11, the logic 0 stored in the latch circuit 11 discharges the voltage level of the bit line coupled to the latch circuit 11 to the low voltage level. However, the electric charge on the bit line is also poured to the cell storage node (Na or Nb) of the latch circuit 11 coupled to the bit line when the bit value of logic 0 is read from the latch circuit 11. Furthermore, since the access (pass) transistor (Me or Mf) forms a voltage divider with the pull-down N-type field effect transistor of the inverter in the latch circuit 11, the cell storage node (Na or Nb) of the latch circuit 11 may suffer from a disturb voltage, which is called the read-select-disturb phenomenon. If the disturb voltage level is large enough to flip the opposite side inverter of the latch circuit 11, the logic value stored in the latch circuit 11 could be changed. Accordingly, the sense amplifier may read a wrong value from the latch circuit 11.

Furthermore, in the process of reading or writing the bit value into the latch circuit 11, when the voltage level of the word line 14 is charged to the high voltage level, all of the access (pass) transistors in the static random access memory cells coupled to the word line 14 are turned on, then the static random access memories that are coupled to the word line 14 but not coupled to the bit line 12 and 16 may also suffer from a disturb phenomenon similar to the read-select-disturb phenomenon. Therefore, the logics values stored in the aforementioned static random access memory cells could be changed, which is called the half-select-disturb phenomenon. When the half-select-disturb phenomenon occurs in the process of reading, the half-select-disturb phenomenon is also called read half-select-disturb; and when the half-select-disturb phenomenon occurs in the process of writing, the half-select-disturb phenomenon is also called write half-select-disturb.

Since the access (pass) transistors (e.g., the transistors Me and Mf in FIG. 1) have both the role of passing the write-in data into the latch circuit 11 and passing the read-out data to the bit lines, the stability of the data stored in the latch circuit 11 and the data write-in speed of the static random access memory is a trade-off. To reduce read-select-disturb and half-select-disturb, the access (pass) transistors need to be sized down. On the other hand, to improve write margin and write-in speed, the access (pass) transistors need to be sized up. In addition, the supply voltage level of the static random access memory is getting lower in advanced manufacturing processes, and therefore the threshold voltage ($V_T$) of the field effect transistor in the static random access memory is lower also, while the spread of $V_T$ (called $V_T$ scatter) becomes larger. Accordingly, the stability of the data stored in the latch circuit 11 is more easily affected by the spread (variation) of the threshold voltage ($V_T$) of the field effect transistor in the static random access memory. Therefore, providing a stable and high speed static random access memory cell is a significant concern in this field.

SUMMARY OF THE INVENTION

One of the objectives of the present invention is to provide a disturb-free static random access memory cell operable under a wide range of supply voltage, and has a high density and high data accessing speed.

According to a first embodiment of the present invention, a disturb-free static random access memory cell is disclosed. The disturb-free static random access memory cell comprises a latch circuit, a first switching circuit, a second switching circuit, a third switching circuit, and a sensing amplifier. The latch circuit has a first access terminal and a second access terminal. The first switching circuit has a first bit transferring terminal coupled to the first access terminal, a first control terminal coupled to a first write word line, and a second bit transferring terminal. The second switching circuit has a third bit transferring terminal coupled to the second access terminal, a second control terminal coupled to a second write word line, and a fourth bit transferring terminal coupled to the second bit transferring terminal. The third switching circuit has a fifth bit transferring terminal coupled to the fourth bit transferring terminal, a third control terminal coupled to a word line, and a sixth bit transferring terminal coupled to a bit line; and a sensing amplifier, coupled to the bit line, for determining the bit value appearing at the bit line.

According to a second embodiment of the present invention, a disturb-free static random access memory cell is disclosed. The disturb-free static random access memory cell comprises a latch circuit, a first switching circuit, a second switching circuit, a third switching circuit, and a fourth switching circuit. The latch circuit has a first access terminal and a second access terminal. The first switching circuit has a first bit transferring terminal coupled to the first access terminal of the latch circuit, a first control terminal coupled to a first write word line, and a second bit transferring terminal. The second switching circuit has a third bit transferring terminal coupled to the second access terminal of the latch circuit, a second control terminal coupled to a second write word line, and a fourth bit transferring terminal coupled to the second bit transferring terminal. The third switching circuit has a fifth bit transferring terminal coupled to the fourth bit transferring terminal, a third control terminal coupled to a word line, and a sixth bit transferring terminal coupled to a bit line. The fourth switching circuit has a control terminal coupled to the first bit transferring terminal of the first switching circuit, a first terminal coupled to the fifth bit transferring terminal of the third switching circuit, and a second terminal coupled to a reference voltage level, wherein a first control signal at the first control terminal of the first switching circuit and a second control signal at the second control terminal of the second switching circuit are column based signals, the first control signal and the second control signal are arranged to control the first switching circuit and the second switching circuit coupled along the bit line respectively, a third control signal at the third control terminal of the third switching circuit is a row based signal, the third control signal is arranged to control the third switching circuit coupled along the word line, and when the disturb-free static random access memory cell is under a data read mode, the first control signal is arranged to not turn on the first switching circuit, and the second control signal is arranged to not turn on the second switching circuit.

According to a third embodiment of the present invention, a disturb-free static random access memory cell is disclosed. The disturb-free static random access memory cell comprises a latch circuit, a first switching circuit, a second switching circuit, a third switching circuit, and a fourth switching circuit. The latch circuit has a first access terminal and a second access terminal. The first switching circuit has a first bit transferring terminal coupled to the first access terminal of the latch circuit, a first control terminal coupled to a first write word line, and a second bit transferring terminal. The second switching circuit has a third bit transferring terminal coupled to the second access terminal of the latch circuit, a second control terminal coupled to a second write word line, and a fourth bit transferring terminal coupled to the second bit transferring terminal. The third switching circuit has a fifth bit transferring terminal coupled to the fourth bit transferring terminal, a third control terminal coupled to a word line, and a sixth bit transferring terminal coupled to a bit line. The fourth switching circuit has a control terminal coupled to the first bit transferring terminal of the first switching circuit, a first terminal coupled to the fifth bit transferring terminal of the third switching circuit, and a second terminal coupled to a reference voltage level, wherein a first control signal at the first control terminal of the first switching circuit and a second control signal at the second control terminal of the second switching circuit are column based signals, the first control signal and the second control signal are arranged to control the first switching circuit and the second switching circuit coupled along the bit line respectively, a third control signal at the third control terminal of the third switching circuit is a row based signal, the third control signal is arranged to control the third switching circuit coupled along the word line, and when the disturb-free static random access memory cell is under a sleep mode, and when the bit line and the reference voltage level correspond to the same logic value, the word line is arranged to not turn on the third switching circuit, the first control signal is arranged to not turn on the first switching circuit, and the second control signal is arranged to not turn on the second switching circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
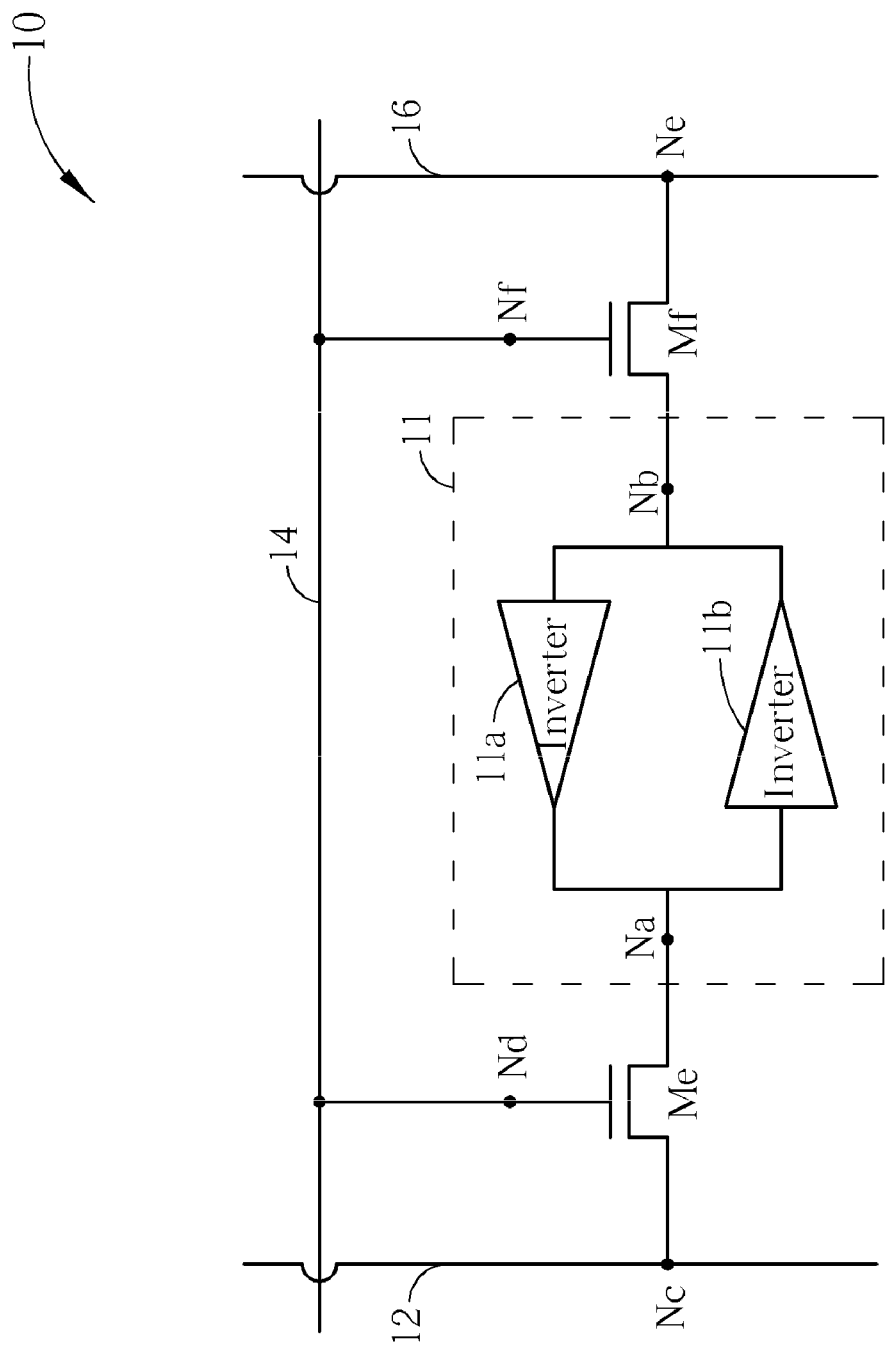
FIG. 1 is a diagram illustrating a conventional 6-T static random access memory cell.
Figure 2:
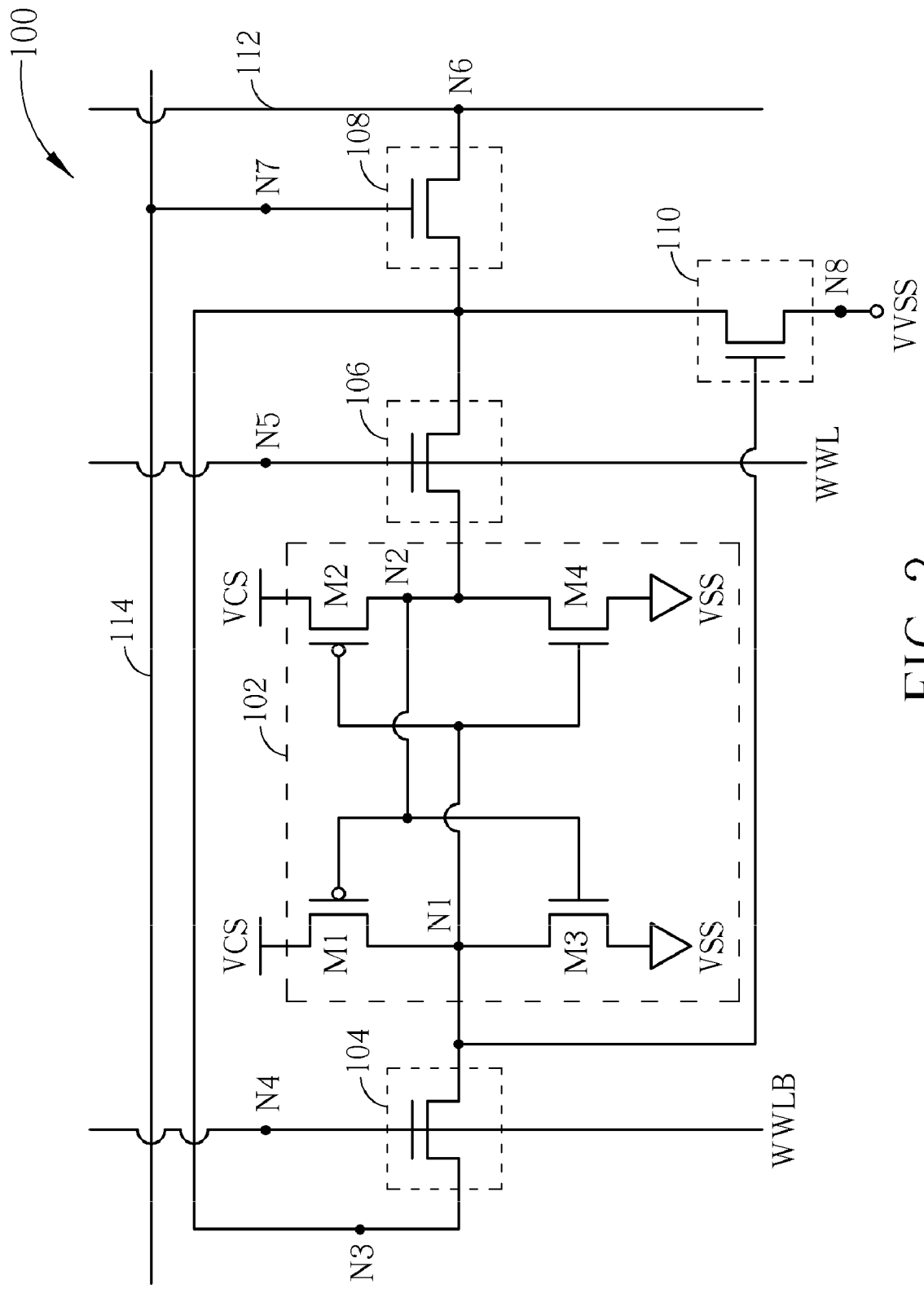
FIG. 2 is a diagram illustrating a disturb-free static random access memory cell according to an embodiment of the present invention.

Please refer to FIG. 2. FIG. 2 is a diagram illustrating a disturb-free static random access memory cell 100 according to an embodiment of the present invention. The disturb-free static random access memory cell 100 comprises a latch circuit 102, a first switching circuit 104, a second switching circuit 106, a third switching circuit 108, a fourth switching circuit 110, and a sensing amplifier (not shown in FIG. 2). The latch circuit 102 is arranged to store a data bit (i.e., the logic 1 or logic 0). In this embodiment, the latch circuit 102 comprises four field effect transistors M1-M4, wherein the transistor M1, M3 are configured as a first inverter, the transistors M2, M4 are configured as a second inverter, and the first inverter and the second inverter is arranged to have a positive feedback loop, i.e., a latch. More specifically, the output terminal N1 (i.e., a first access terminal of the latch circuit) of the first inverter is coupled to an input terminal of the second inverter, and the output terminal N2 (i.e., a second access terminal of the latch circuit) of the second inverter is coupled to an input terminal of the first inverter. Furthermore, the latch circuit 102 operates between a supply voltage VCS and a ground voltage VSS. The first switching circuit 104 has a first terminal (i.e., a bit transferring terminal of the first switching circuit 104) coupled to the output terminal N1 of the latch circuit 102, a second terminal N3 (i.e., the other bit transferring terminal of the first switching circuit 104), and a control terminal N4 for receiving a first control signal WWLB. The second switching circuit 106 has a first terminal (i.e., a bit transferring terminal of the second switching circuit 106) coupled to the output terminal N2 of the latch circuit 102, a second terminal (i.e., the other bit transferring terminal of the second switching circuit 106) coupled to the second terminal N3 of the first switching circuit 104, and a control terminal N5 coupled to a second control signal WWL. The third switching circuit 108 has a first terminal (i.e., a bit transferring terminal of the third switching circuit 108) coupled to the second terminal N3 of the first switching circuit, a second terminal N6 (i.e., the other bit transferring terminal of the third switching circuit 108) coupled to a bit line 112, and a control terminal N7 coupled to a word line 114. The fourth switching circuit 110 has a control terminal coupled to the output terminal N1 of the latch circuit 102, a first terminal coupled to the first terminal N3 of the third switching circuit 108, and a second terminal N8 coupled to a reference voltage VVSS, wherein the first control signal WWLB of the first switching circuit 104 and the second control signal WWL of the second switching circuit 106 are column based signals for controlling the first switching circuit 104 and the second switching circuit 106 coupled along the bit line 112; and the control terminal N4 (which is coupled to the word line 114) of the third switching circuit 108 is a row based signal for controlling the third switching circuit 108 coupled along the word line 114. In addition, the sensing amplifier is coupled to the bit line 112 for determining a bit value appearing at the bit line 112.

According to the embodiment of the disturb-free static random access memory cell 100, the first switching circuit 104, the second switching circuit 106, the third switching circuit 108 and the fourth switching circuit 110 are implemented by N-type field effect transistors, and their connectivity is shown in FIG. 2. Since the disturb-free static random access memory cell 100 comprises eight field effect transistors, the disturb-free static random access memory cell 100 is also called 8-T disturb-free static random access memory cell. Furthermore, when the disturb-free static random access memory cell 100 is under a data write mode, the first control signal WWLB and the second control signal WWL respectively control the first switching circuit 104 and the second switching circuit 106 to not turn on at the same time. More specifically, when the disturb-free static random access memory cell 100 is under the data write mode, the first control signal WWLB and the second control signal WWL respectively control the on/off of the first switching circuit 104 and the second switching circuit 106 according to a data bit being written into the latch circuit 102. In other words, when the data bit being written into the latch circuit 102 corresponds to a first logic value, and when the bit line 112 corresponds to a second logic value different from the first logic value, the word line 114 turns on the third switching circuit 108, the first control signal WWLB turns on the first switching circuit 104 and the second control signal WWL does not turn on the second switching circuit 106; and when the data bit being written in the latch circuit 102 corresponds to the second logic value, and when the bit line 112 corresponds to the second logic value, the word line 114 turns on the third switching circuit 108, the first control signal WWLB does not turn on the first switching circuit 104 and the second control signal WWL turns on the second switching circuit 106.

In addition, when the disturb-free static random access memory cell 100 is under a data read mode, when the voltage level of the bit line 112 is the first logic value, and when the reference voltage VVSS is the second logic value different from the first logic, the word line 114 turns on the third switching circuit 108, the first control signal WWLB does not turn on the first switching circuit 104, and the second control signal WWL does not turn on the second switching circuit 106. When the disturb-free static random access memory cell 100 is under a sleep mode, and when the bit line 112 and the reference voltage VVSS correspond to the same logic value, the word line 114 does not turn on the third switching circuit 108, the first control signal WWLB does not turn on the first switching circuit 104, and the second control signal WWL does not turn on the second switching circuit 106.

Figure 3:
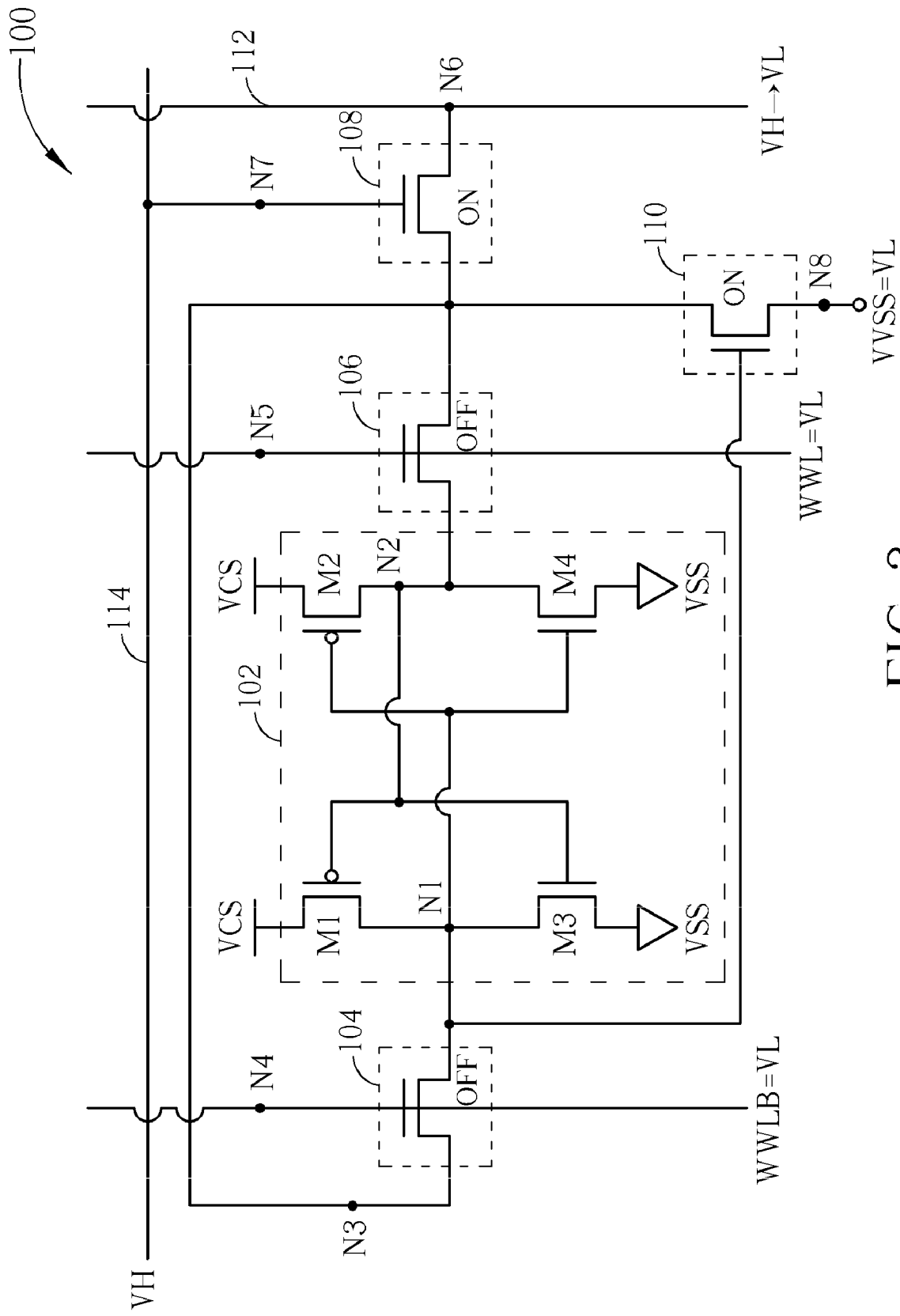
FIG. 3 is a diagram illustrating the disturb-free static random access memory cell under a data read mode.

Please refer to FIG. 3. FIG. 3 is a diagram illustrating the disturb-free static random access memory cell 100 under the data read mode. When the disturb-free static random access memory cell 100 is under the data read mode, the voltage levels of the first control signal WWLB and the second control signal WWL are at the low voltage level VL to turn off the first switching circuit 104 and the second switching circuit 106 respectively. The voltage level of the bit line 112 is first charged to the high voltage level VH, i.e., the first logic value is the high voltage level VH and the reference voltage VVSS is at the low voltage level VL. Then, the voltage level of the word line 114 is charged to the high voltage level VH for turning on the third switching circuit 108. When the third switching circuit 108 is turned on, the voltage level of the bit line 112 is discharged to the reference voltage VVSS or to stay at the high voltage level VH according to the data bit stored in the latch circuit 102. More specifically, in this embodiment, when the data bit stored in the latch circuit 102 is logic 0, then the voltage level at the output terminal N1 is the high voltage level VH. Therefore, the fourth switching circuit 110 is turned on by the high voltage level VH. Accordingly, the electric charges on the bit line 112 pass through the third switching circuit 108 and the fourth switching circuit 110 to charge the second terminal N8 of the fourth switching circuit 110, and then the voltage level of the bit line 112 is discharged to the low voltage level VL. Otherwise, when the data bit stored in the latch circuit 102 is logic 1, the voltage level of the output terminal N1 is the low voltage level VL, therefore the fourth switching circuit 110 is turned off. Accordingly, the electric charges on the bit line 112 are not discharged to the second terminal N8 of the fourth switching circuit 110, and the voltage level of the bit line 112 is kept at the high voltage level VH. Therefore, when the disturb-free static random access memory cell 100 is under the data read mode, a sensing unit (e.g., the sensing amplifier of the present embodiment) of the disturb-free static random access memory cell 100 can be employed to detect the voltage level of the bit line 112 for determining the data bit stored in the latch circuit 102.

Please note that, when the disturb-free static random access memory cell 100 is under the data read mode, the first switching circuit 104 and the second switching circuit 106 are not turned on, therefore the electric charges on the bit line 112 will not affect the data bit stored in the latch circuit 102. In other words, the present embodiment overcomes the read-select-disturb problem faced by the conventional 6-T static random access memory. Similarly, when the disturb-free static random access memory cell 100 is under the data read mode, the third switching circuit in a specific disturb-free static random access memory cell that couples to the word line 114 is also turned on. However, since the first switching circuit and the second switching circuit in the specific disturb-free static random access memory cell are not turned on, the electric charges on the bit line coupled to the specific disturb-free static random access memory cell will not affect the data bit stored in the latch circuit of the specific disturb-free static random access memory cell. Therefore, the present embodiment also overcomes the read half-select-disturb problem faced by the conventional 6-T static random access memory.

Figure 4:
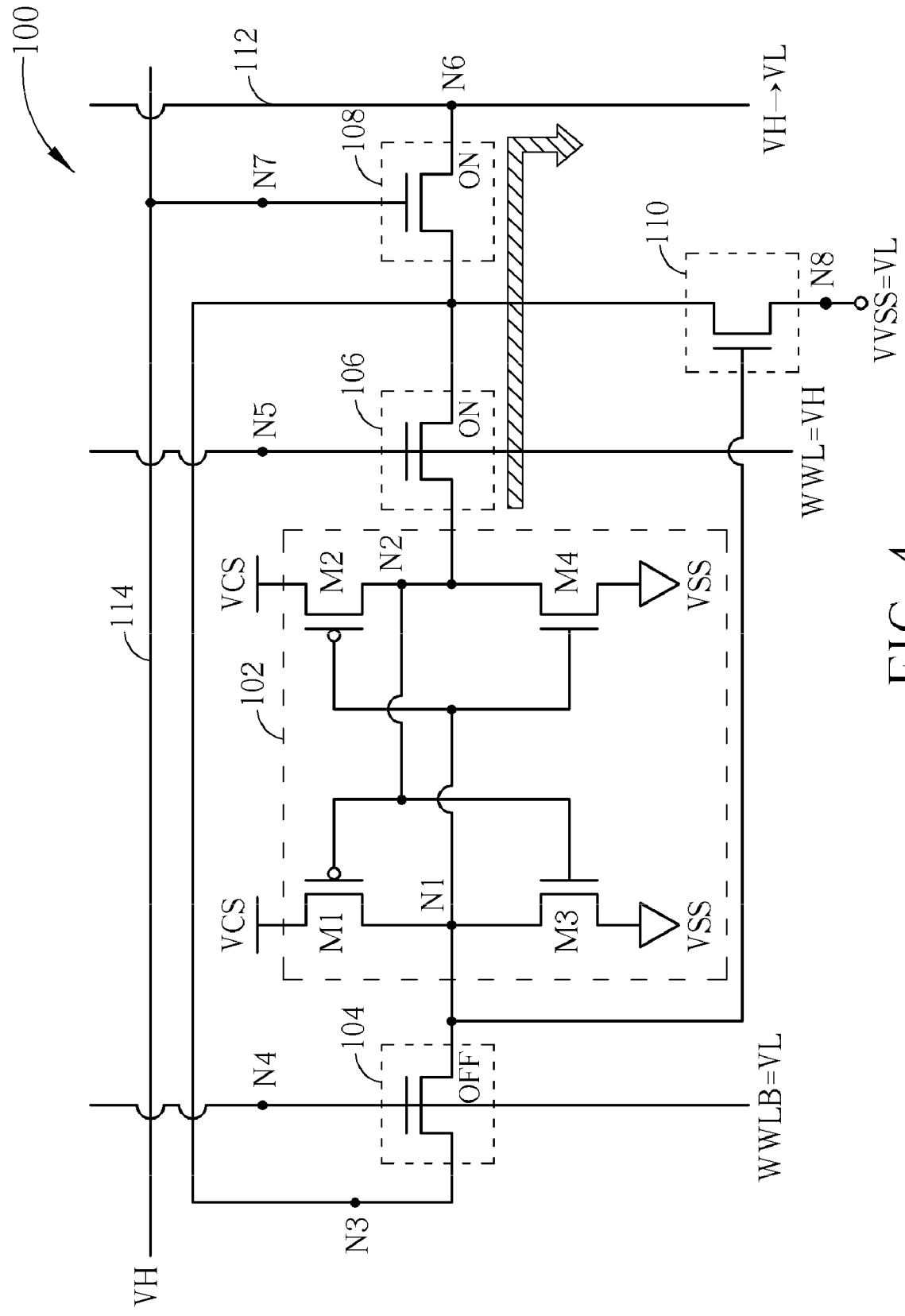
FIG. 4 is a diagram illustrating the disturb-free static random access memory cell under a data write mode when the data being written into the latch circuit is logic 0.

Please refer to FIG. 4. FIG. 4 is a diagram illustrating the disturb-free static random access memory cell 100 under the data write mode when the data being written into the latch circuit 102 is logic 0. In this embodiment, when the disturb-free static random access memory cell 100 is going to write the data bit of logic 0 into the latch circuit 102, a control unit of the disturb-free static random access memory cell 100 first charges the voltage level of the bit line 112 to the high voltage level VH, and sets the reference voltage VVSS at the low voltage level VL. Then, the control unit sets the voltage level of the first control signal WWLB at the low voltage level VL to turn off the first switching circuit 104, and sets the voltage level of the second control signal WWL at the high voltage level VH to turn on the second switching circuit 106. Meanwhile, the voltage level of the word line 114 is charged to the high voltage level VH for turning on the third switching circuit 108. Then, the voltage level of the bit line 112 of the disturb-free static random access memory cell 100 is discharged to the low voltage level VL. Since the second switching circuit 106 and the third switching circuit 108 are turned on, the electric charges on the output terminal N2 of the latch circuit 102 are discharged to the low voltage level VL of the bit line 112. Then, the voltage level of the output terminal N2 (i.e., the data Q of the latch circuit) becomes the low voltage level VL, and the voltage level of the output terminal N1 (i.e., the data QB of the latch circuit) of the latch circuit 102 becomes the high voltage level VH. Accordingly, the data bit of logic 0 is written into the latch circuit 102.

Figure 5:
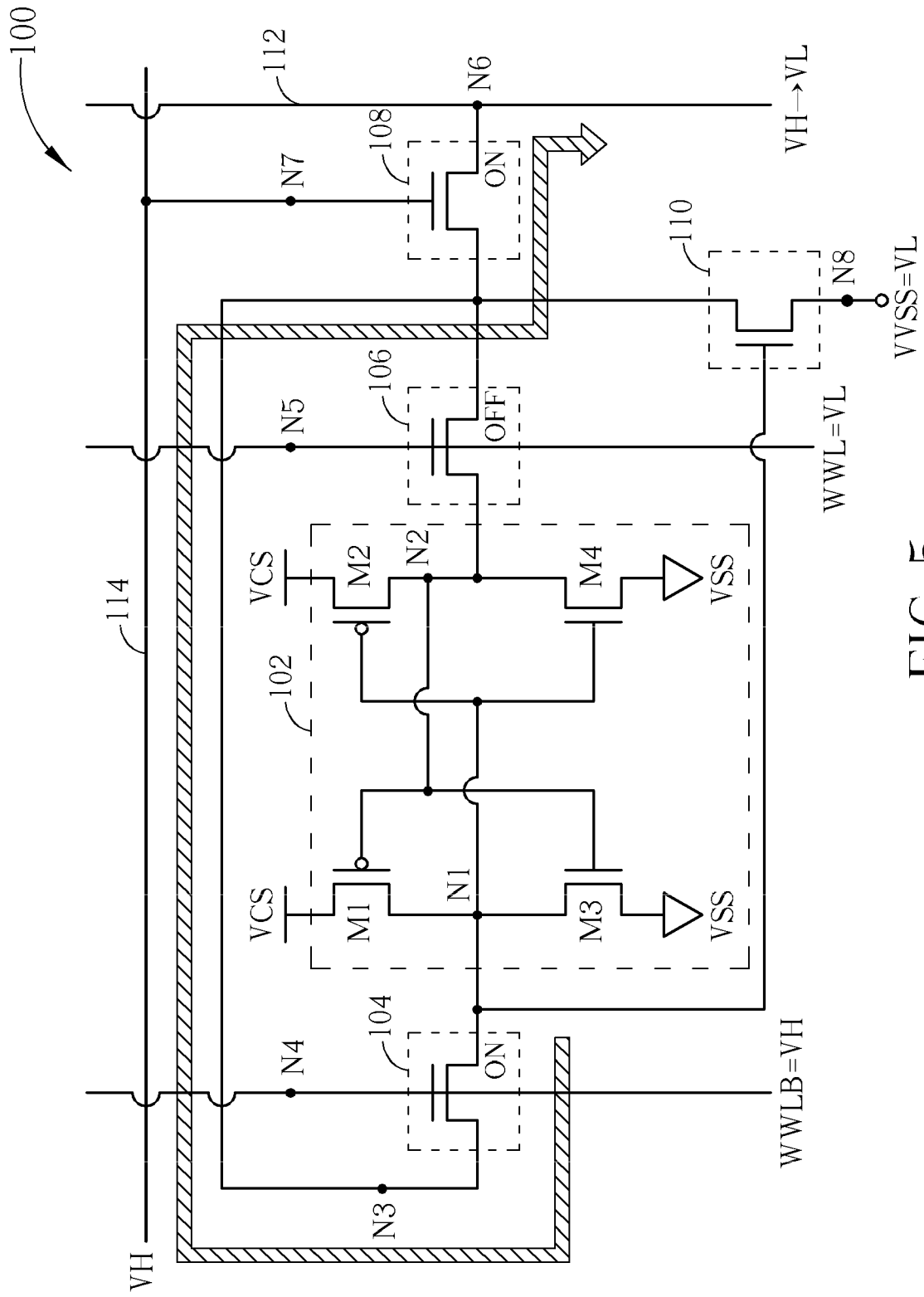
FIG. 5 is a diagram illustrating the disturb-free static random access memory cell under the data write mode when the data being written into the latch circuit is logic 1.

FIG. 5 is a diagram illustrating the disturb-free static random access memory cell 100 under the data write mode when the data being written into the latch circuit 102 is logic 1. In this embodiment, when the disturb-free static random access memory cell 100 is going to write the data bit of logic 1 into the latch circuit 102, the control unit of the disturb-free static random access memory cell 100 first charges the voltage level of the bit line 112 to the high voltage level VH, and sets the reference voltage VVSS at the low voltage level VL. Then, the control unit sets the voltage level of the first control signal WWLB at the high voltage level VH to turn on the first switching circuit 104, and sets the voltage level of the second control signal WWL at the low voltage level VL to turn off the second switching circuit 106. Meanwhile, the voltage level of the word line 114 is charged to the high voltage level VH for turning on the third switching circuit 108. Then, the voltage level of the bit line 112 of the disturb-free static random access memory cell 100 is discharged to the low voltage level VL. Since the first switching circuit 104 and the third switching circuit 108 are turned on, the electric charges on the output terminal N1 of the latch circuit 102 are discharged to the low voltage level VL of the bit line 112. Then, the voltage level of the output terminal N1 (i.e., the data QB of the latch circuit) becomes the low voltage level VL, and the voltage level of the output terminal N2 (i.e., the data Q of the latch circuit) of the latch circuit 102 becomes the high voltage level VH. Accordingly, the data bit of logic 1 is written into the latch circuit 102.

According to FIG. 4 and FIG. 5, to write the data bit into the latch circuit 102 precisely, the control unit turns on one of the first switching circuit 104 and the second switching circuit 106, and turns off the other of the first switching circuit 104 and the second switching circuit 106 according to the logic value of the data bit. Furthermore, no matter whether the data bit being written into the latch circuit 102 is logic 0 or logic 1, the voltage level of the bit line 112 coupled to the disturb-free static random access memory cell 100 is always set to the low voltage level VL for discharging the electric charges in the latch circuit 102 via the N-type pass transistor (e.g., the first switching circuit 104, the second switching circuit 106, or/and the third switching circuit 108). Therefore, the disturb-free static random access memory cell 100 has the same high efficiency of writing the logic 0 and logic 1 into the latch circuit 102. In other words, the disturb-free static random access memory cell 100 improves the speed of writing data into the latch circuit 102. In addition, when the data bit being written into the latch circuit 102 is logic 1, the disturb-free static random access memory cell 100 discharges the latch circuit 102 via N-type pass transistor to write the data bit of logic 1 into the latch circuit 102 rather than charges the latch circuit 102, thus the disturb-free static random access memory cell 100 is able to operate under low voltage. Furthermore, the disturb-free static random access memory cell 100 only utilizes one external switching circuit (i.e., the third switching circuit 108) to connect two internal switching circuits (i.e., the first switching circuit 104 and the second switching circuit 106), and only utilizes one bit line 112 to write/read the data bit stored in the latch circuit 102; therefore the size/area of the disturb-free static random access memory cell 100 can be reduced greatly.

Please refer to FIG. 4 in conjunction with FIG. 5. The control signals (i.e., WWLB, WWL) of the first switching circuit 104 and the second switching circuit 106 are column based signals, and the signal on the control terminal N7, which is coupled to the word line 114, of the third switching circuit 108 is a row based signal, therefore only the third switching circuit 108 and one of the first switching circuit 104 and the second switching circuit 106 of the chosen latch circuit (located in the mid-point of the chosen row and the chosen column) are turned on to perform the write-in process when the disturb-free static random access memory cell 100 is under the data write mode. Please note that, when the disturb-free static random access memory cell 100 is under the data write mode, the first switching circuit and the second switching circuit in the half-select cell that couples to the same word line 114 are not turned on, and the third switching circuit in the half-select cell that couples to the same bit line 112 is not turned on. Therefore, the electric charges on a specific bit line of the specific disturb-free static random access memory cell (i.e., the half-select cell) will not affect the data bit stored in a specific latch circuit of the specific disturb-free static random access memory cell. In other words, the present embodiment also overcomes the write half-select-disturb problem faced by the conventional 6-T static random access memory 10.

Figure 6:
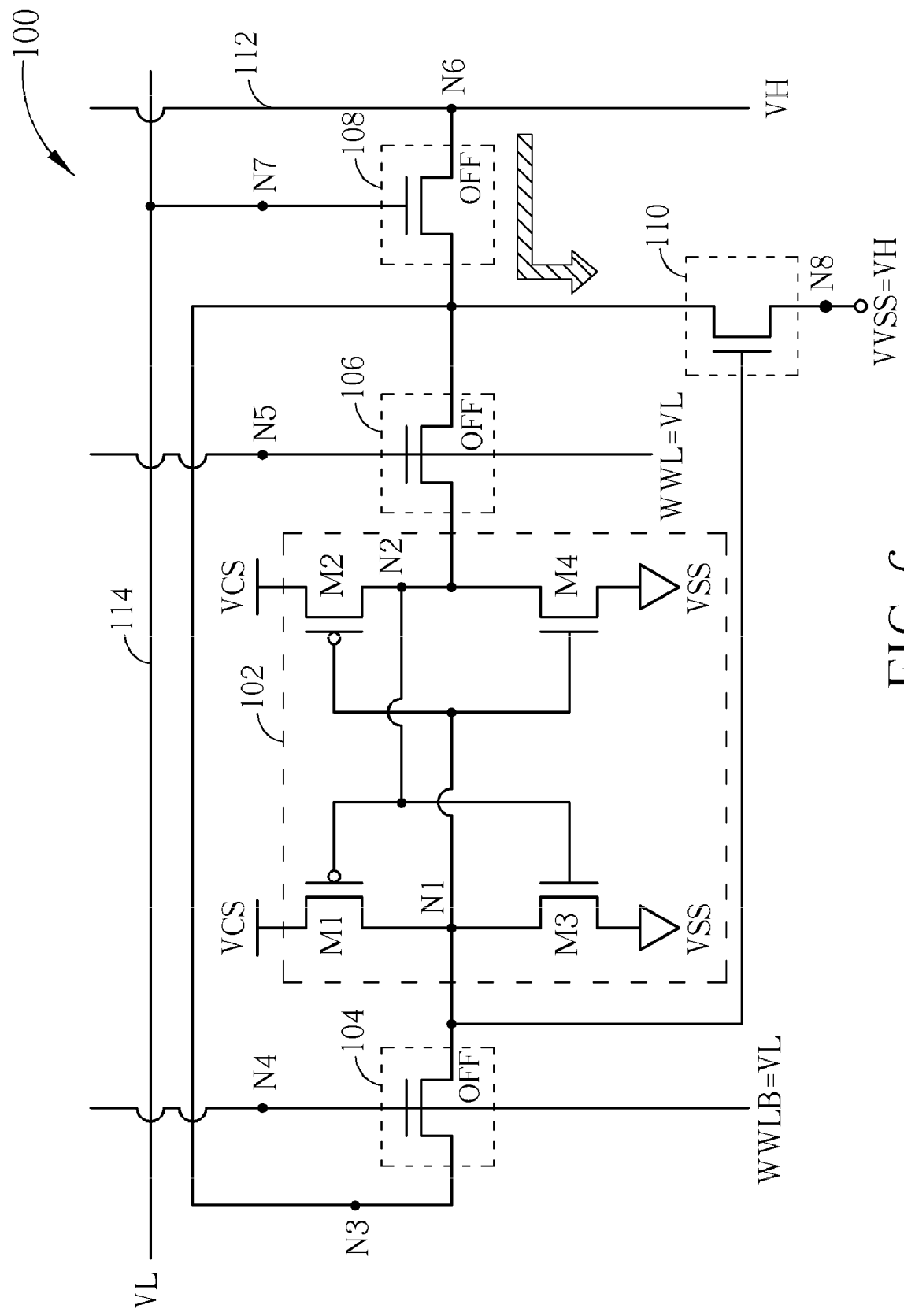
FIG. 6 is a diagram illustrating the disturb-free static random access memory cell under a sleep mode.

Please refer to FIG. 6. FIG. 6 is a diagram illustrating the disturb-free static random access memory cell 100 under the sleep mode. In the embodiment, when the disturb-free static random access memory cell 100 is under the sleep mode, the control unit of the disturb-free static random access memory cell 100 charges the voltage level of the bit line 112 to the high voltage level VH, discharges the voltage level of the word line 114 to the low voltage level VL to turn off the third switching circuit 108, and sets the voltage levels of the first control signal WWLB and the second control signal WWL at the low voltage level VL to turn off the first switching circuit 104 and the second switching circuit 106 respectively. Furthermore, to reduce the leakage current caused by the bit line 112, the control unit raises the voltage level of the reference voltage VVSS. For example, when the disturb-free static random access memory cell 100 is under the sleep mode, the control unit sets the voltage level of the reference voltage VVSS at the high voltage level VH. Accordingly, the path between the bit line 112 and the second terminal N8 of the fourth switching circuit 110 is opened by a switching circuit (i.e., the third switching circuit 108), and the voltage level of the bit line 112 equals the voltage level of the second terminal N8 of the fourth switching circuit 110. Therefore, the electric charges on the bit line 112 will not leak to the second terminal N8 of the fourth switching circuit 110 via the fourth switching circuit 110.

Figure 7:
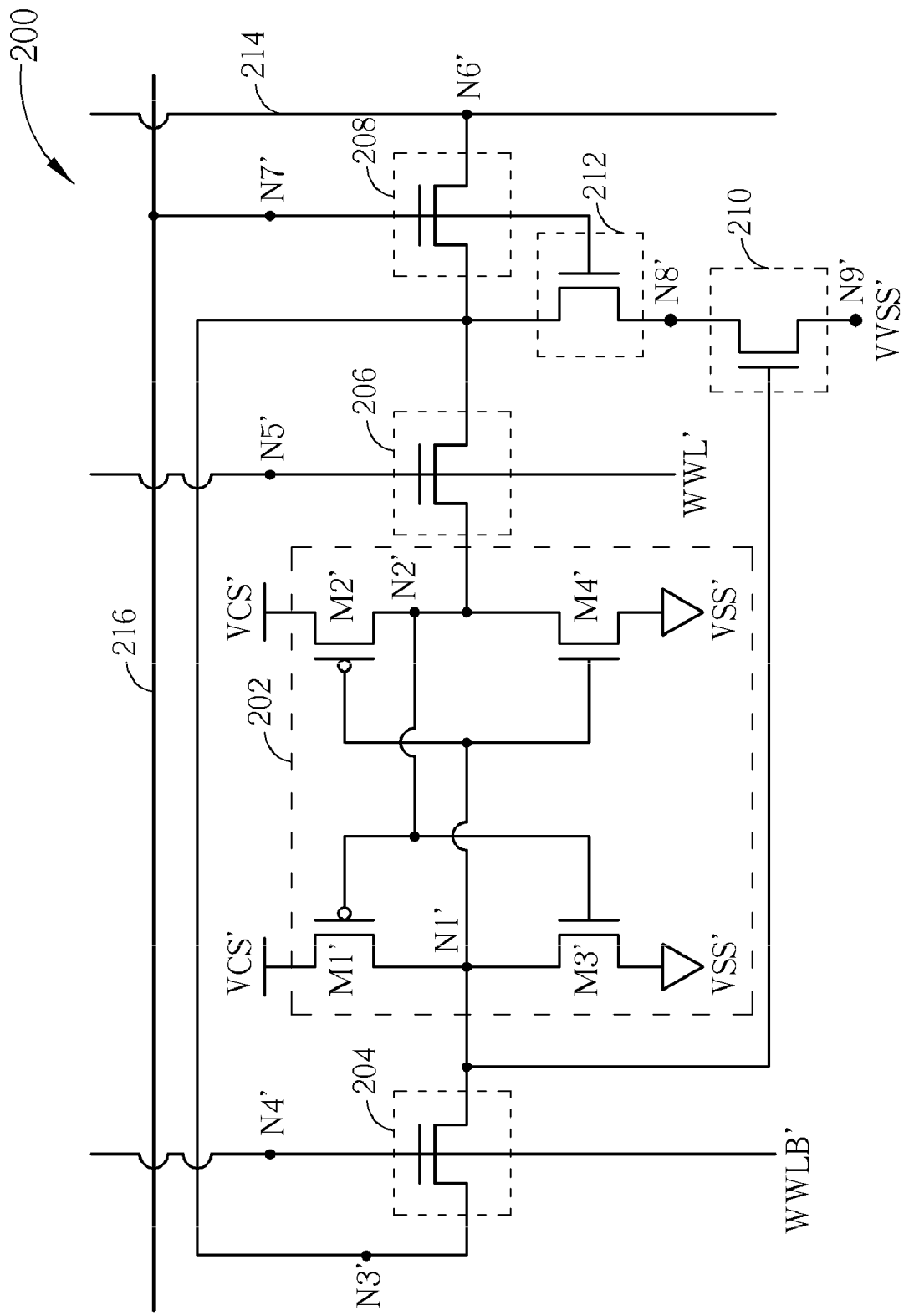
FIG. 7 is a diagram illustrating a disturb-free static random access memory cell according to a second embodiment of the present invention.

Furthermore, to improve the leakage problem of the disturb-free static random access memory cell 100 under the sleep mode, a fifth switching circuit is further introduced in another embodiment of the disturb-free static random access memory cell 200 of the present invention as shown in FIG. 7. FIG. 7 is a diagram illustrating a disturb-free static random access memory cell 200 according to a second embodiment of the present invention. The disturb-free static random access memory cell 200 comprises a latch circuit 202, a first switching circuit 204, a second switching circuit 206, a third switching circuit 208, a fourth switching circuit 210, and a fifth switching circuit 212. The latch circuit 202 is arranged to store a data bit (i.e., the logic 1 or logic 0). Similar to the first embodiment disturb-free static random access memory cell 100, the latch circuit 202 comprises four field effect transistors M1'-M4', which are configured as a positive feedback loop, i.e., a latch. Furthermore, the latch circuit 202 is operated between a supply voltage VCS' and a ground voltage VSS'. The first switching circuit 204 has a first terminal coupled to the output terminal N1' of the latch circuit 202, a second terminal N3', and a control terminal N4' for receiving a first control signal WWLB'. The second switching circuit 206 has a first terminal coupled to the output terminal N2' of the latch circuit 202, a second terminal coupled to the second terminal N3' of the first switching circuit 204, and a control terminal N5' coupled to a second control signal WWL'. The third switching circuit 208 has a first terminal coupled to the second terminal N3' of the first switching circuit, a second terminal N6' coupled to a bit line 214, and a control terminal N7' coupled to a word line 216. The fourth switching circuit 210 has a control terminal coupled to the output terminal N1' of the latch circuit 202, a first terminal N8', and a second terminal N9' coupled to a reference voltage VVSS'. The fifth switching circuit 212 has a first terminal coupled to the first terminal of the third switching circuit 208, a second terminal coupled to the first terminal of the fourth switching circuit (i.e., N8'), and a control terminal coupled to the word line 216 (i.e., N7'), wherein the first control signal WWLB' of the first switching circuit 204 and the second control signal WWL' of the second switching circuit 206 are column based signals for controlling the first switching circuit 204 and the second switching circuit 206 coupled along the bit line 214; and the control terminal N7' (which is coupled to the word line 216) of the third switching circuit 208 is a row based signal for controlling the third switching circuit 208 coupled along the word line 216.

According to the disturb-free static random access memory cell 200, the first switching circuit 204, the second switching circuit 206, the third switching circuit 208, the fourth switching circuit 210, and the fifth switching circuit 212 are implemented by N-type field effect transistors, and their connectivity is shown in FIG. 7. Since the disturb-free static random access memory cell 200 comprises nine field effect transistors, the disturb-free static random access memory cell 200 is also called 9-T disturb-free static random access memory cell. Similar to the disturb-free static random access memory cell 100, when the disturb-free static random access memory cell 200 is under a data write mode, the first control signal WWLB' and the second control signal WWL' respectively control the first switching circuit 204 and the second switching circuit 206 to not turn on at the same time. More specifically, when the disturb-free static random access memory cell 200 is under the data write mode, the first control signal WWLB' and the second control signal WWL' respectively control the on/off of the first switching circuit 204 and the second switching circuit 206 according to a data bit being written into the latch circuit 202. In other words, when the data bit being written into the latch circuit 202 corresponds to a first logic value, and when the bit line 214 corresponds to a second logic value different from the first logic value, the word line 216 turns on the third switching circuit 208, the first control signal WWLB' turns on the first switching circuit 204 and the second control signal WWL' does not turn on the second switching circuit 206; and when the data bit being written into the latch circuit 202 corresponds to the second logic value, and when the bit line 214 corresponds to the second logic value, the word line 216 turns on the third switching circuit 208, the first control signal WWLB' does not turn on the first switching circuit 204 and the second control signal WWL' turns on the second switching circuit 206.

In addition, when the disturb-free static random access memory cell 200 is under a data read mode, when the voltage level of the bit line 214 is the first logic value, and when the reference voltage VVSS' is the second logic value different from the first logic value, the word line 216 turns on the third switching circuit 208 and the fifth switching circuit 212, the first control signal WWLB' does not turn on the first switching circuit 204, and the second control signal WWL' does not turn on the second switching circuit 206. When the disturb-free static random access memory cell 200 is under a sleep mode, and when the bit line 214 and the reference voltage VVSS' correspond to the same logic value (i.e., the first logic value), the word line 216 does not turn on the third switching circuit 208 and the fifth switching circuit 212, the first control signal WWLB' does not turn on the first switching circuit 204, and the second control signal WWL' does not turn on the second switching circuit 206.

Figure 8:
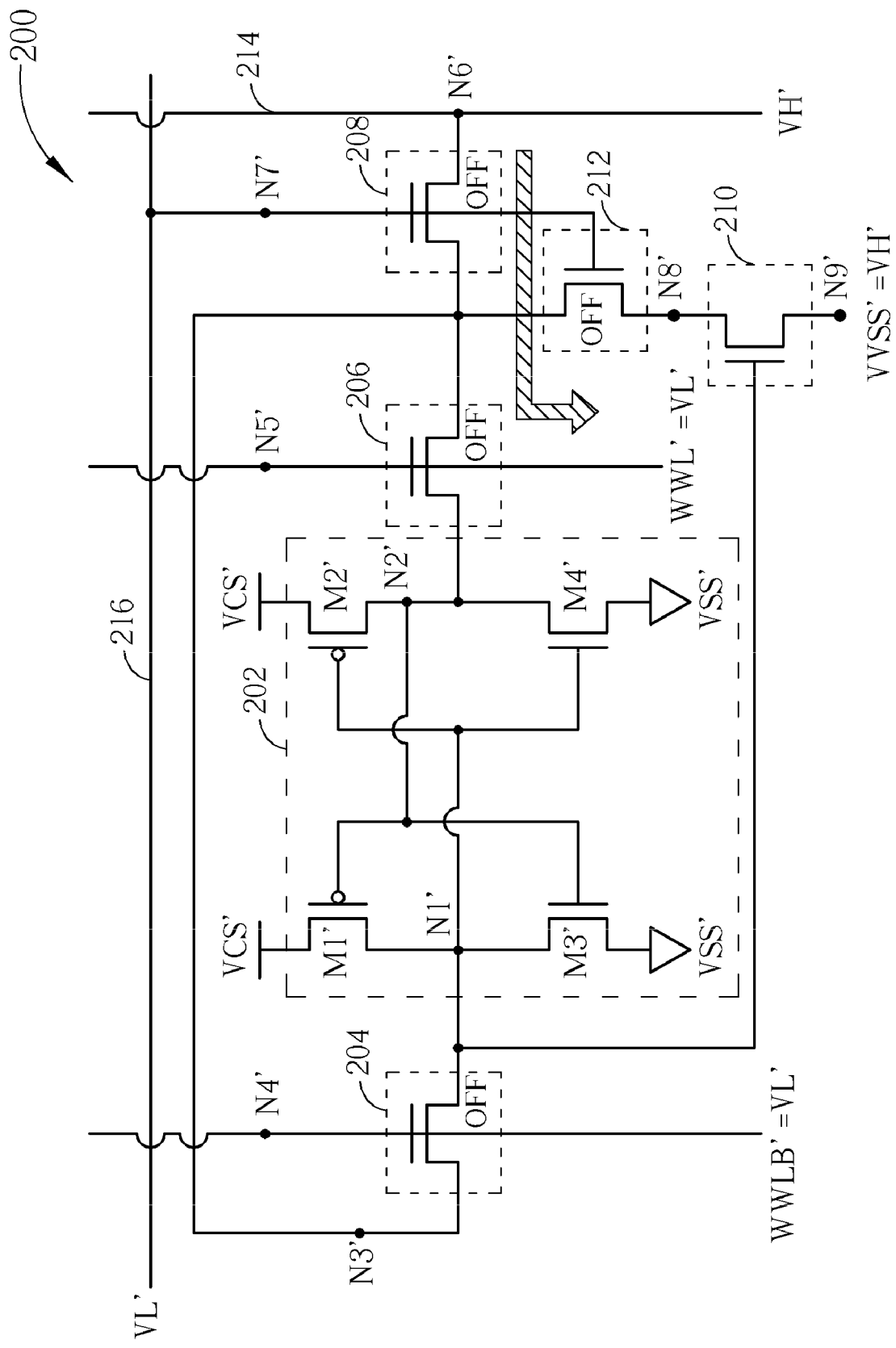
FIG. 8 is a diagram illustrating the disturb-free static random access memory cell in FIG. 7 under the sleep mode.

Please note that the operations of the data read mode, the data write mode, and the sleep mode of the disturb-free static random access memory cell 200 are similar to those of the disturb-free static random access memory cell 100. In other words, the aforementioned data read mode, the data write mode, and the sleep mode of the disturb-free static random access memory cell 100 are also adapted to the disturb-free static random access memory cell 200, thus the detailed description is omitted here for brevity. The following description is focused on the operation related to the newly added fifth switching circuit 212. Please refer to FIG. 8. FIG. 8 is a diagram illustrating the disturb-free static random access memory cell 200 under the sleep mode. When the disturb-free static random access memory cell 200 is under the sleep mode, the control unit of the disturb-free static random access memory cell 200 charges the voltage level of the bit line 214 to the high voltage level VH', discharges the voltage level of the word line 216 to the low voltage level VL' to turn off the third switching circuit 208 and fifth switching circuit 212, and sets the voltage levels of the first control signal WWLB' and the second control signal WWL' at the low voltage level VL' to turn off the first switching circuit 204 and the second switching circuit 206 respectively. Meanwhile, the control unit raises the voltage level of the reference voltage VVSS'. For example, when the disturb-free static random access memory cell 200 is under the sleep mode, the control unit sets the voltage level of the reference voltage VVSS' at the high voltage level VH'. Accordingly, the path between the bit line 214 and the second terminal N9' of the fourth switching circuit 210 is opened by the two switching circuits (i.e., the third switching circuit 208 and the fifth switching circuit 212), and the voltage level of the bit line 214 equals the voltage level of the second terminal N9' of the fourth switching circuit 210. Therefore, the electric charges on the bit line 214 will not leak to the second terminal N9' of the fourth switching circuit 210 via the fourth switching circuit 210.

Please note that the disturb-free static random access memory cell 100 and the disturb-free static random access memory cell 200 are not limited by the aforementioned data write mode, the data read mode, and the sleep mode. Those skilled in the art should understand that the disturb-free static random access memory cell 100 and the disturb-free static random access memory cell 200 may only perform one or two of the aforementioned modes, i.e., the data write mode, the data read mode, and the sleep mode.

Figure 9:
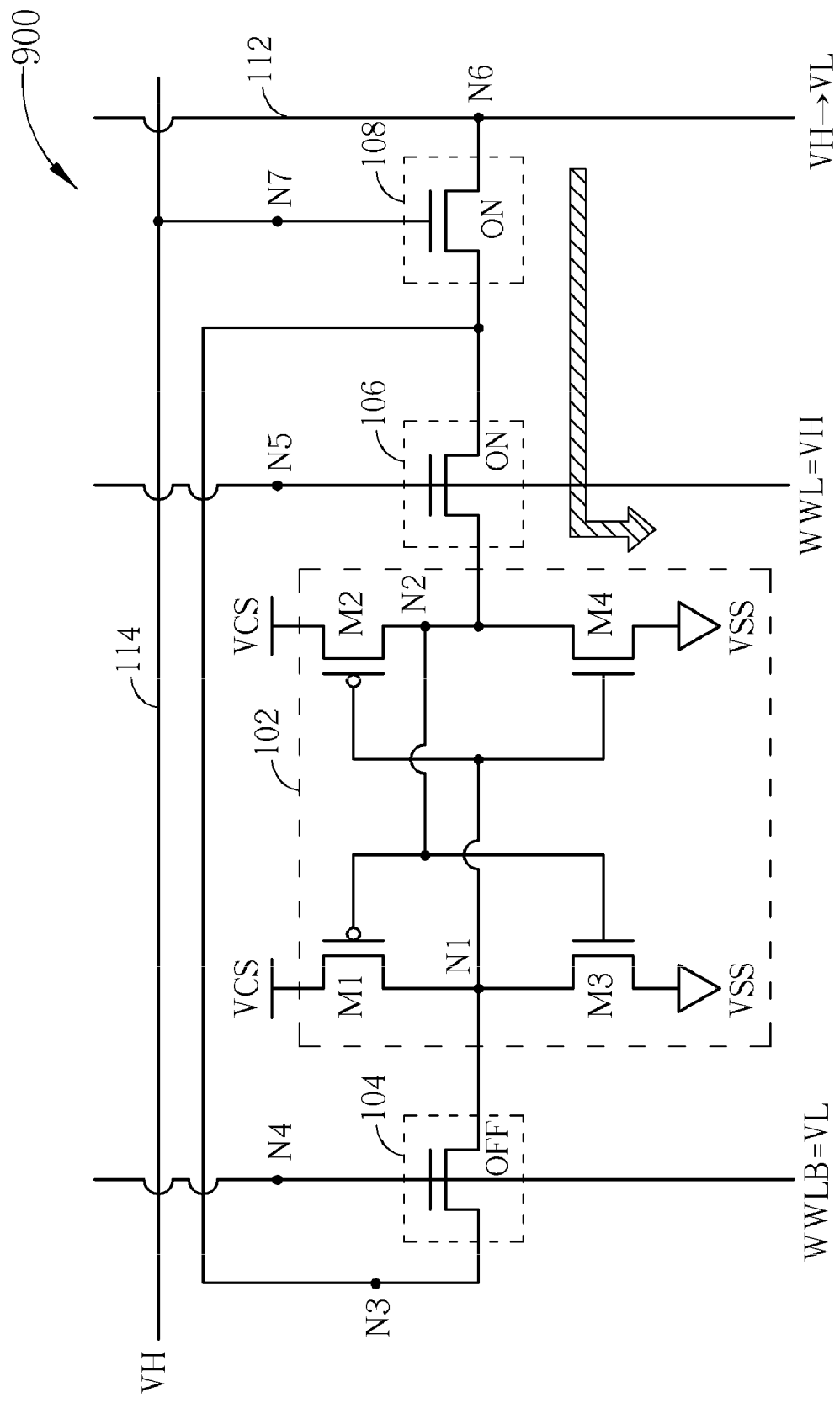
FIG. 9 is a diagram illustrating the disturb-free static random access memory cell under the data read mode according to another embodiment of the present invention.

In addition, please refer to FIG. 3 in conjunction with FIG. 9. FIG. 9 is a diagram illustrating the disturb-free static random access memory cell 900 under the data read mode according to another embodiment of the present invention. Compared with the disturb-free static random access memory cell 100 shown in FIG. 3, the disturb-free static random access memory cell 900 omits the fourth switching circuit 110 in the disturb-free static random access memory cell 100. For the sake of brevity, the marks of the elements and signals in the disturb-free static random access memory cell 900 are similar to those in the disturb-free static random access memory cell 100; however, those skilled in the art should understand that the electrical characteristic of the elements and signals in the disturb-free static random access memory cell 900 are not limited by the elements and signals in the disturb-free static random access memory cell 100. More specifically, the fourth switching circuit 110 of the disturb-free static random access memory cell 100 is an optional element for the disturb-free static random access memory cell 900. Therefore, the disturb-free static random access memory cell 900 may also comprise a fourth switching circuit of which the operation is similar to the fourth switching circuit 110 of the disturb-free static random access memory cell 100. Similarly, the disturb-free static random access memory cell 900 may also comprise a fourth switching circuit and a fifth switching circuit of which their operations are similar to the fourth switching circuit 210 and the fifth switching circuit 212, respectively, of the disturb-free static random access memory cell 200.

When the disturb-free static random access memory cell 900 is under the data read mode, the voltage level of the first control signal WWLB is the low voltage level VL to turn off the first switching circuit 104, and the voltage level of the second control signal WWL is the high voltage level VH to turn on the second switching circuit 106. Then, the voltage level of the bit line 112 is first charged to the high voltage level VH, i.e., the first logic value. Then, the voltage level of the word line 114 is charged to the high voltage level VH for turning on the third switching circuit 108. When the third switching circuit 108 is turned on, the voltage level of the bit line 112 is discharged to the reference voltage VSS (i.e., the low voltage level VL) or to remain at the high voltage level VH according to the data bit stored in the latch circuit 102. More specifically, in this embodiment, when the data bit stored in the latch circuit 102 is logic 0, then the voltage level at the output terminal N2 is the low voltage level VL. Accordingly, the electric charges on the bit line 112 pass through the second switching circuit 106 and the third switching circuit 108, and then through the cell (i.e., the latch circuit 102) pull-down N-type field effect transistor (i.e., the transistor M4) to VSS (i.e., the low voltage level VL), and the voltage level of the bit line 112 is discharge to the low voltage level VL. Otherwise, when the data bit stored in the latch circuit 102 is logic 1, the voltage level of the output terminal N2 is the high voltage level VH, therefore the electric charges on the bit line 112 are not discharged, and the voltage level of the bit line 112 is kept at the high voltage level VH. Therefore, when the disturb-free static random access memory cell 100 is under the data read mode, a sensing unit (e.g., the sensing amplifier of the present embodiment) of the disturb-free static random access memory cell 900 can be employed to detect the voltage level of the bit line 112 for determining the data bit stored in the latch circuit 102. Please note that, since the operations of the data write mode and the sleep mode of the disturb-free static random access memory cell 900 are similar to those of the disturb-free static random access memory cell 100, the detailed description is omitted here for brevity. Please also note that the disturb-free static random access memory cell 900 overcomes the read half-select-disturb problem and the write half-select-disturb problem faced by the 6-T static random access memory cell 10. Since the data read mode of the disturb-free static random access memory cell 900 is similar to the static random access memory cell 10, the disturb-free static random access memory cell 900 may also have the read-select-disturb problem. However, the data bit stored in the disturb-free static random access memory cell 900 is read out through two switching circuits (i.e., the second switching circuit 106 and the third switching circuit 108), thus the disturb-free static random access memory cell 900 may have less read-select-disturb than that in the 6-T static random access memory cell 10.

Briefly, the disclosed embodiments, i.e., the static random access memories 100, 200, 900 are capable of operating under low supply voltage VCS' to overcome the read-select-disturb, the read half-select-disturb, and the write half-select-disturb problems faced by the 6-T static random access memory cell 10. Furthermore, the static random access memories 100, 200, 900 only utilize one external switching circuit and one bit line; therefore the area of the static random access memories 100, 200, 900 can be greatly reduced.

Those skilled in the art will readily observe that numerous modifications and alterations of the device and method may be made while retaining the teachings of the invention.

What is claimed is:

1. A disturb-free static random access memory cell, comprising:
   a latch circuit, having a first access terminal and a second access terminal;
   a first switching circuit, having a first bit transferring terminal coupled to the first access terminal, a first control terminal coupled to a first write word line, and a second bit transferring terminal;
   a second switching circuit, having a third bit transferring terminal coupled to the second access terminal, a second control terminal coupled to a second write word line, and a fourth bit transferring terminal coupled to the second bit transferring terminal;
   a third switching circuit, having a fifth bit transferring terminal coupled to the fourth bit transferring terminal, a third control terminal coupled to a word line, and a sixth bit transferring terminal coupled to a bit line; and a sensing amplifier, coupled to the bit line, for determining a bit value appearing at the bit line.

2. The disturb-free static random access memory cell of claim 1, wherein a first control signal at the first control terminal of the first switching circuit and a second control signal at the second control terminal of the second switching circuit are column based signals, the first control signal and the second control signal are arranged to control the first switching circuit and the second switching circuit coupled along the bit line respectively, a third control signal at the third control terminal of the third switching circuit is a row based signal, the third control signal is arranged to control the third switching circuit coupled along the word line, and when the disturb-free static random access memory cell is under a data write mode, the first control signal and the second control signal respectively control the first switching circuit and the second switching circuit do not turn on at the same time.

3. The disturb-free static random access memory cell of claim 2, wherein when the disturb-free static random access memory cell is under the data write mode, the first control signal and the second control signal respectively control the switching of the first switching circuit and the second switching circuit according to a data bit being written into the latch circuit.

4. The disturb-free static random access memory cell of claim 3, wherein when the data bit being written into the latch circuit corresponds to a first logic value, and when a voltage level of the bit line is a second logic value different from the first logic value, the word line is arranged to turn on the third switching circuit, the first control signal is arranged to turn on the first switching circuit and the second control signal is arranged to not turn on the second switching circuit; and when the data bit being written into the latch circuit corresponds to the second logic value, and when the voltage level of the bit line is the second logic value, the word line is arranged to turn on the third switching circuit, the first control signal is arranged to not turn on the first switching circuit and the second control signal is arranged to turn on the second switching circuit.

5. The disturb-free static random access memory cell of claim 2, wherein when the disturb-free static random access memory cell is under a data read mode, the word line is arranged to turn on the third switching circuit, the first control signal is arranged to not turn on the first switching circuit and the second control signal is arranged to turn on the second switching circuit.

6. The disturb-free static random access memory cell of claim 2, further comprising:
a fourth switching circuit, having a control terminal coupled to the first bit transferring terminal of the first switching circuit, a first terminal coupled to the fifth bit transferring terminal of the third switching circuit, and a second terminal coupled to a reference voltage level.

7. The disturb-free static random access memory cell of claim 6, wherein when the disturb-free static random access memory cell is under a data read mode, when a voltage level of the bit line is a first logic value, and when the reference voltage level is a second logic value different from the first logic value, the word line is arranged to turn on the third switching circuit, the first control signal is arranged to not turn on the first switching circuit, and the second control signal is arranged to not turn on the second switching circuit.

8. The disturb-free static random access memory cell of claim 6, wherein when the disturb-free static random access memory cell is under a sleep mode, and when the bit line and the reference voltage level correspond to a same logic value, the word line is arranged to not turn on the third switching circuit, the first control signal is arranged to not turn on the first switching circuit, and the second control signal is arranged to not turn on the second switching circuit.

9. The disturb-free static random access memory cell of claim 6, further comprising:
a fifth switching circuit, having a first terminal coupled to the fifth bit transferring terminal of the third switching circuit, a second terminal coupled to the first terminal of the fourth switching circuit, and a control terminal coupled to the word line.

10. The disturb-free static random access memory cell of claim 9, wherein when the disturb-free static random access memory cell is under a data read mode, when a voltage level of the bit line is a first logic value, and when the reference voltage level is a second logic value different from the first logic value, the word line is arranged to turn on the third switching circuit and the fifth switching circuit, the first control signal is arranged to not turn on the first switching circuit, and the second control signal is arranged to not turn on the second switching circuit.

11. The disturb-free static random access memory cell of claim 9, wherein when the disturb-free static random access memory cell is under a sleep mode, and when the bit line and the reference voltage level correspond to a same logic value, the word line is arranged to not turn on the third switching circuit and the fifth switching circuit, the first control signal is arranged to not turn on the first switching circuit, and the second control signal is arranged to not turn on the second switching circuit.

12. A disturb-free static random access memory cell, comprising:
a latch circuit, having a first access terminal and a second access terminal;
a first switching circuit, having a first bit transferring terminal coupled to the first access terminal of the latch circuit, a first control terminal coupled to a first write word line, and a second bit transferring terminal;
a second switching circuit, having a third bit transferring terminal coupled to the second access terminal of the latch circuit, a second control terminal coupled to a second write word line, and a fourth bit transferring terminal coupled to the second bit transferring terminal;
a third switching circuit, having a fifth bit transferring terminal coupled to the fourth bit transferring terminal, a third control terminal coupled to a word line, and a sixth bit transferring terminal coupled to a bit line; and
a fourth switching circuit, having a control terminal coupled to the first bit transferring terminal of the first switching circuit, a first terminal coupled to the fifth bit transferring terminal of the third switching circuit, and a second terminal coupled to a reference voltage level;
wherein a first control signal at the first control terminal of the first switching circuit and a second control signal at the second control terminal of the second switching circuit are column based signals, the first control signal and the second control signal are arranged to control the first switching circuit and the second switching circuit coupled along the bit line respectively, a third control signal at the third control terminal of the third switching circuit is a row based signal, the third control signal is arranged to control the third switching circuit coupled along the word line, and when the disturb-free static random access memory cell is under a data read mode, the first control signal is arranged to not turn on the first switching circuit, and the second control signal is arranged to not turn on the second switching circuit.

13. The disturb-free static random access memory cell of claim 12, wherein when the
disturb-free static random access memory cell is under the data read mode, when a voltage level of the bit line is a first logic value, and when the reference voltage level is a second logic value different from the first logic value, the word line is arranged to turn on the third switching circuit.

14. The disturb-free static random access memory cell of claim 12, wherein when the disturb-free static random access memory cell is under a sleep mode, and when the bit line and the reference voltage level correspond to a same logic value, the word line is arranged to not turn on the third switching circuit, the first control signal is arranged to not turn on the first switching circuit, and the second control signal is arranged to not turn on the second switching circuit.

15. A disturb-free static random access memory cell, comprising:
a latch circuit, having a first access terminal and a second access terminal;
a first switching circuit, having a first bit transferring terminal coupled to the first access terminal of the latch circuit, a first control terminal coupled to a first write word line, and a second bit transferring terminal;
a second switching circuit, having a third bit transferring terminal coupled to the second access terminal of the latch circuit, a second control terminal coupled to a second write word line, and a fourth bit transferring terminal coupled to the second bit transferring terminal;
a third switching circuit, having a fifth bit transferring terminal coupled to the fourth bit transferring terminal, a third control terminal coupled to a word line, and a sixth bit transferring terminal coupled to a bit line; and
a fourth switching circuit, having a control terminal coupled to the first bit transferring terminal of the first switching circuit, a first terminal coupled to the fifth bit transferring terminal of the third switching circuit, and a second terminal coupled to a reference voltage level;
wherein a first control signal at the first control terminal of the first switching circuit and a second control signal at the second control terminal of the second switching circuit are column based signals, the first control signal and the second control signal are arranged to control the first switching circuit and the second switching circuit coupled along the bit line respectively, a third control signal at the third control terminal of the third switching circuit is a row based signal, the third control signal is arranged to control the third switching circuit coupled along the word line, and when the disturb-free static random access memory cell is under a sleep mode, and when the bit line and the reference voltage level correspond to a same logic value, the word line is arranged to not turn on the third switching circuit, the first control signal is arranged to not turn on the first switching circuit, and the second control signal is arranged to not turn on the second switching circuit.

16. The disturb-free static random access memory cell of claim 15, further comprising:
a fifth switching circuit, having a first terminal coupled to the fifth bit transferring terminal of the third switching circuit, a second terminal coupled to the first terminal of the fourth switching circuit, and a control terminal coupled to the word line;
wherein when the disturb-free static random access memory cell is under the sleep mode, the word line is arranged to not turn on the third switching circuit and the fifth switching circuit.

* * * * *